United States Patent
Buuck

(10) Patent No.: US 9,036,835 B2
(45) Date of Patent: May 19, 2015

(54) COMBINING AN AUDIO POWER AMPLIFIER AND A POWER CONVERTER IN A SINGLE DEVICE

(75) Inventor: David C. Buuck, Santa Clara, CA (US)

(73) Assignee: AliphCom, San Francisco, CA (US)

(*) Notice: Subject to any disclaimer, the term of this patent is extended or adjusted under 35 U.S.C. 154(b) by 1127 days.

(21) Appl. No.: 11/982,956

(22) Filed: Nov. 5, 2007

(65) Prior Publication Data

US 2009/0116663 A1    May 7, 2009

(51) Int. Cl.
*H03F 99/00*    (2009.01)
*H03F 3/217*    (2006.01)

(52) U.S. Cl.
CPC .......... *H03F 3/217* (2013.01); *H03F 2200/03* (2013.01)

(58) Field of Classification Search
CPC ....... H03F 3/217; H03F 3/68; H03F 2200/03; H03F 3/181; H03F 3/72; H03F 3/20; H03F 3/213
USPC ........... 381/120, 150; 330/251, 297, 307, 10, 330/130, 135, 129, 127; 73/514.01
See application file for complete search history.

(56) References Cited

U.S. PATENT DOCUMENTS

| | | | | |
|---|---|---|---|---|
| 5,450,037 A | * | 9/1995 | Kanaya et al. | 330/297 |
| 5,777,519 A | * | 7/1998 | Simopoulos | 330/297 |
| 5,875,250 A | * | 2/1999 | Kuo et al. | 381/120 |
| 6,243,472 B1 | * | 6/2001 | Bilan et al. | 381/117 |
| 6,373,340 B1 | * | 4/2002 | Shashoua | 330/297 |
| 6,683,494 B2 | * | 1/2004 | Stanley | 330/10 |
| 7,076,070 B2 | * | 7/2006 | Pearce et al. | 381/120 |
| 7,952,426 B2 | * | 5/2011 | Mun | 330/10 |
| 2003/0048911 A1 | * | 3/2003 | Furst et al. | 381/96 |
| 2003/0067348 A1 | * | 4/2003 | Butler | 330/10 |
| 2004/0161122 A1 | * | 8/2004 | Nielsen | 381/117 |
| 2006/0039572 A1 | * | 2/2006 | Mun | 381/106 |

FOREIGN PATENT DOCUMENTS

WO    WO 2007049898 A1 *    5/2007

* cited by examiner

*Primary Examiner* — Vivian Chin
*Assistant Examiner* — Con P Tran
(74) *Attorney, Agent, or Firm* — Kokka & Backus, PC

(57) ABSTRACT

An apparatus is described that includes an audio power amplifier having an input and an output. An alternating-current to direct-current power converter is coupled to the audio power amplifier in a single package to supply power to the audio power amplifier.

19 Claims, 6 Drawing Sheets

US 9,036,835 B2

COMBINING AN AUDIO POWER AMPLIFIER AND A POWER CONVERTER IN A SINGLE DEVICE

FIELD

Embodiments of the invention relate to audio devices. In particular, embodiments of the invention relate to audio power amplification and power conversion.

BACKGROUND

Audio solutions today include a discrete audio power amplifier and a discrete power supply for that audio power amplifier. Care must be taken when designing a power supply for an audio power amplifier to ensure the power supply provides enough power and responds quickly enough to the power demands of the audio power amplifier to ensure the audio power amplifier performs as designed. For example, a power supply may not be robust enough to prevent a voltage droop as the power demands of an audio power amplifier increase. Such a voltage droop typically causes the audio amplifier to operate outside of its ideal operating range, typically resulting in distortion of the output. This distortion results in an unsatisfactory listening experience.

One solution to avoid the problem of an underperforming power supply is to overdesign the power supply. Overdesigning the power supply includes using more robust and/or higher performance components to ensure the power supply will be capable of delivering the power needs of an audio power amplifier. The use of more robust and higher performance components typically adds to the cost of the power supplies. Thus, the power supplies are more expensive to build. Moreover, the efficiency of the power supply is typically degraded because the power supply is designed to produce more power than is needed. Furthermore, the additional components typically add to the overall size and weight of the power supply making the power supply more difficult to use in small audio devices or systems.

Another solution to overcome voltage droop is through the use of a regulated power supply. Design of a regulated power supply typically adds an extra layer of complexity to a power supply. Therefore, special attention is typically needed to ensure the power supply remains stable during all modes of operation.

Another goal in designing power supplies for audio power amplifiers is to ensure the power supply adequately responds to the needs of the audio power amplifier quickly. In other words, the transient response of a power supply must adequately supply power to an audio power amplifier as the power demands of the audio signal change. Failure of the power supply to quickly react to the demands of the audio power amplifier typically results in distortion of the output. The failure of a power supply to meet the transient needs of the audio amplifier typically results in poor performance of the audio amplifier, typically resulting in distortion at the output.

SUMMARY

An apparatus is described that includes an audio power amplifier having an input and an output. An alternating-current to direct-current power converter is coupled to the audio power amplifier in a single package to supply power to the audio power amplifier.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Embodiments of an integrated circuit ("IC") are described that include an audio power amplifier and a power converter to provide power to the audio amplifier. In particular, an integrated circuit is described that includes an audio power amplifier with a power converter that converts an input voltage into an output voltage to meet the power demands of the audio power amplifier. The integration of an audio power amplifier and an AC to DC power converter into a single integrated circuit helps to provide a single solution for a designer without the necessary complications of designing a power converter for a particular audio amplifier. Furthermore, the integration of an audio power amplifier with a power converter helps to minimize the cubic volume required.

Figure 1:
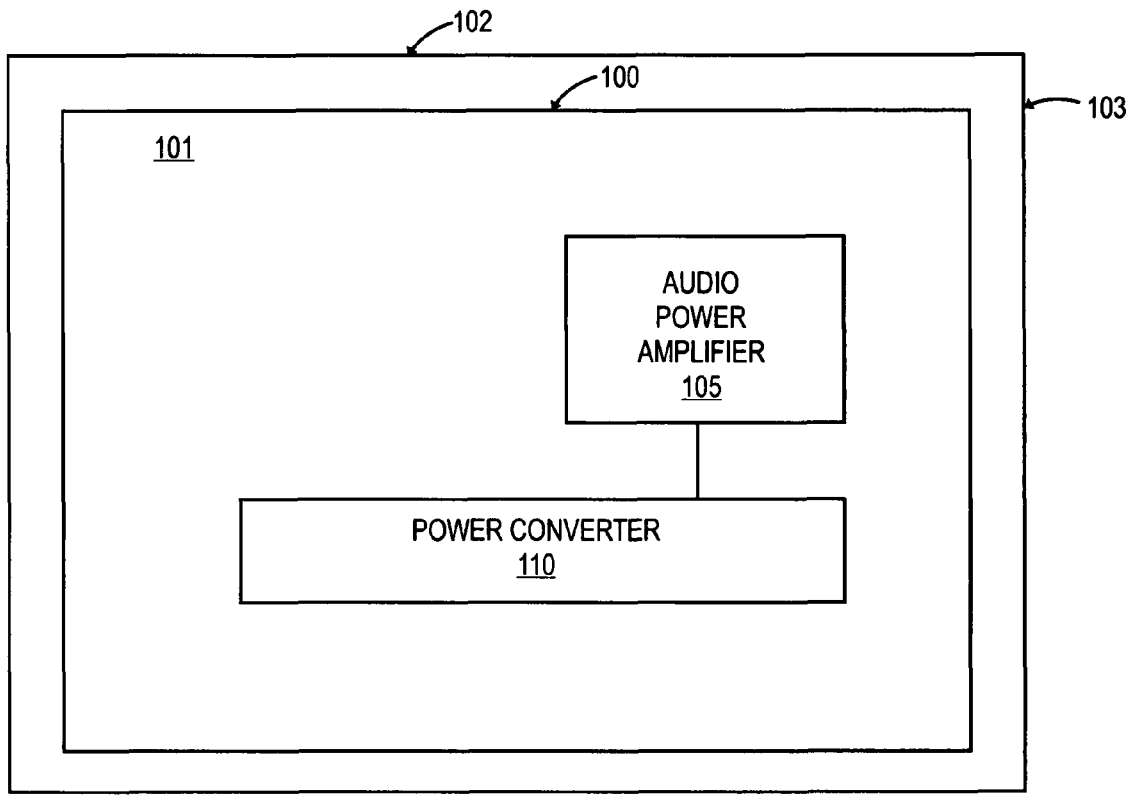
FIG. 1 shows a device that includes an audio power amplifier and a power converter on a single integrated circuit.

FIG. 1 shows a single device 103 containing both an audio power amplifier 105 and a power converter 110. FIG. 1 shows an integrated circuit 100 that includes an audio power amplifier 105 and a power converter 110 residing on the same substrate 101 within an integrated circuit package 102. The audio power amplifier 105 is coupled to the power converter 110 and both reside within the integrated circuit 100 on a single substrate 101.

Figure 2:
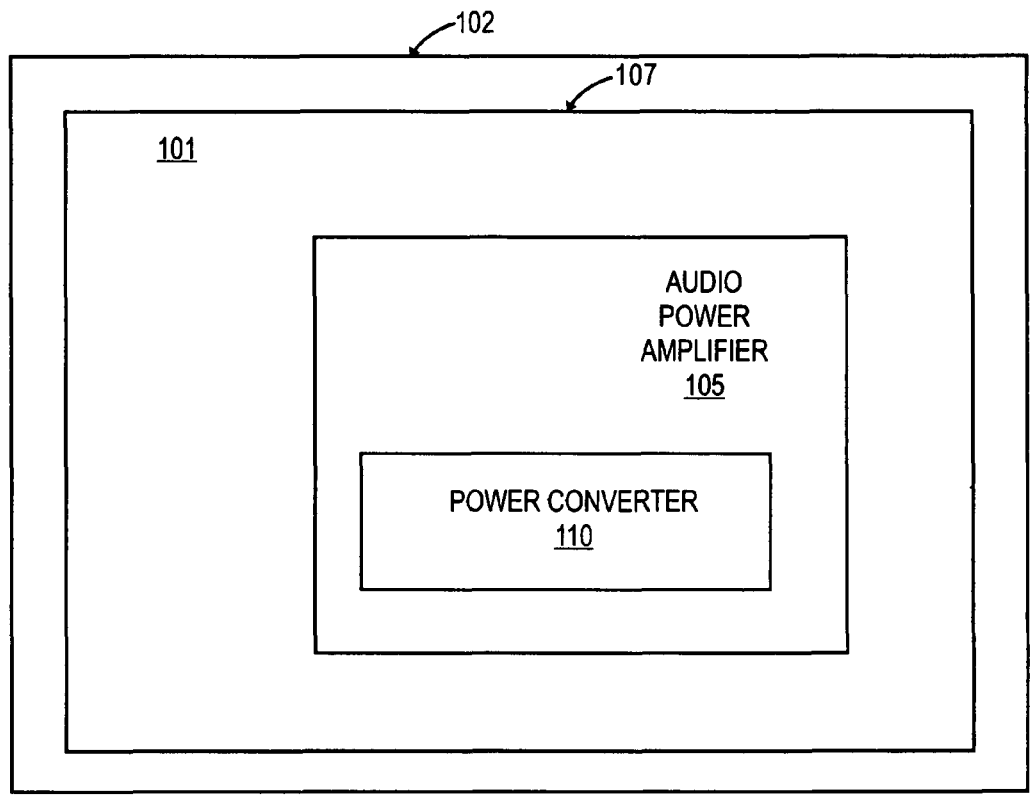
FIG. 2 shows another embodiment of a device with a tightly integrated audio power amplifier and power converter on a single integrated circuit.

FIG. 2 illustrates an embodiment of the invention wherein the power converter 110 is tightly integrated with the audio power amplifier 105 on the same substrate 101 of integrated circuit 107 within the same package 102. FIG. 2 shows the power converter 110 as a subset of and being surrounded by the audio power amplifier 105. For an alternative embodiment (not shown), the circuitry is reversed and the audio power amplifier 105 is a subset of and is surrounded by the power converter 110.

Figure 3:
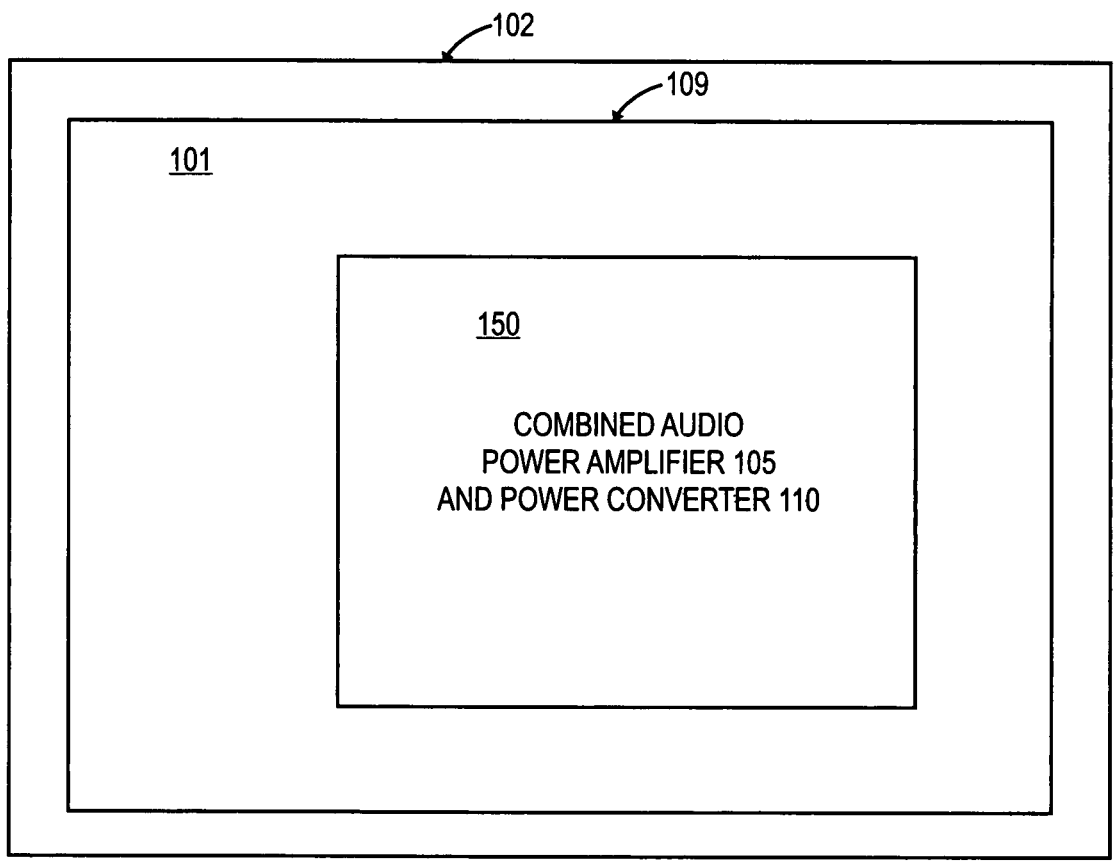
FIG. 3 shows a combined audio power amplifier and power converter on a single integrated circuit.

FIG. 3 shows another embodiment of the invention. In FIG. 3, a combined 150 audio power amplifier 105 and power converter 110 resides on substrate 101. Combined 150 audio power amplifier 105 and power converter 110 are part of integrated circuit 109 that resides within package 102. The circuitry of combined 150 audio power amplifier 105 and power converter 110 is tightly integrated, with circuits providing the audio power amplifier function intermixed with the circuits providing the power converter function.

Figure 4:
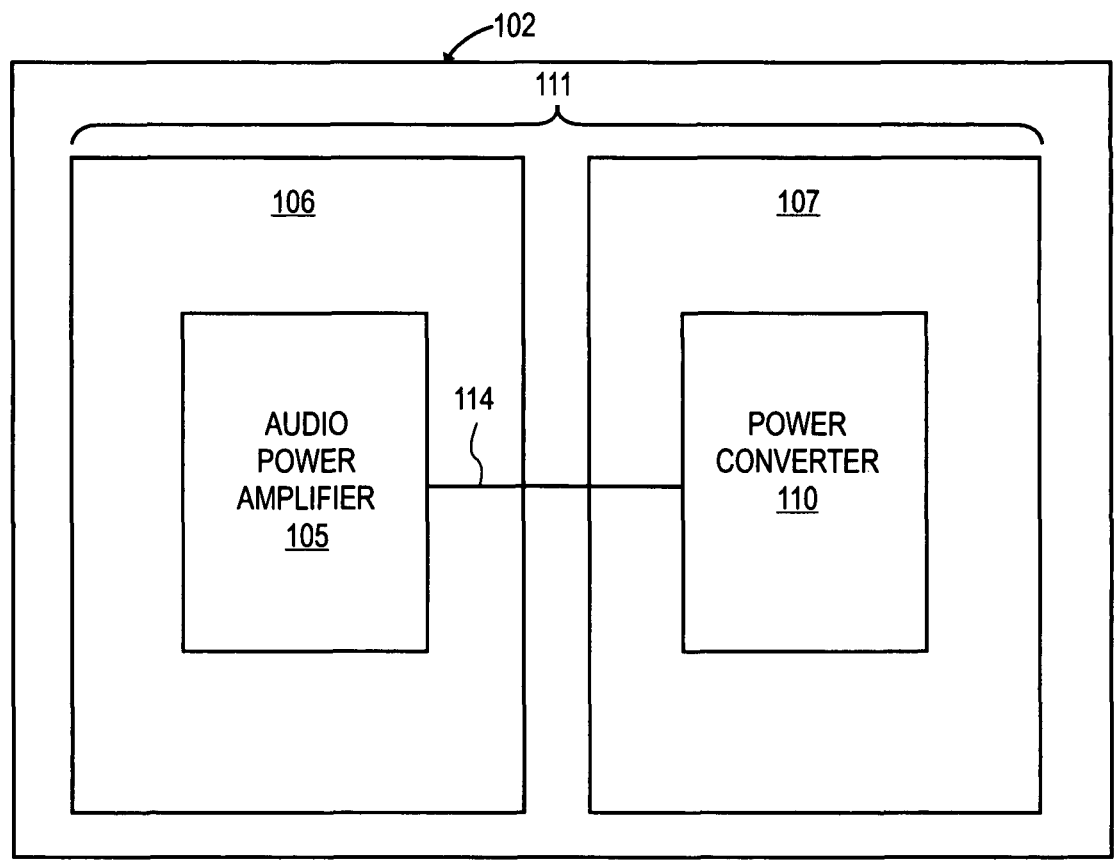
FIG. 4 illustrates a single package that includes both an audio power amplifier on one substrate and a power converter on another substrate.

FIG. 4 shows another embodiment of the invention. In FIG. 4, the audio power amplifier 105 and the power converter 110 are on separate respective substrates 106 and 107 within integrated circuit package 104. Integrated circuit 111 is comprised of circuitry on substrates 106 and 107. An interconnect 114 couples power converter 110 to audio power amplifier 105. Interconnect 114 can be comprised of conductive materials, such as aluminum, copper, or other metallic materials.

For various embodiments, package 102 can be a dual inline package ("DIP"), a flip-chip style package, a ball grid array package, a stacked package, or a chipscale package, for example.

Audio power amplifier 105 of FIGS. 1-4 may be any circuit used to convert low-level, high-impedance audio signals to high-level, low impedance audio signals. Examples of audio power amplifiers that may be used include class A audio amplifiers, class B audio amplifiers, class D audio amplifiers, class E audio amplifiers, class F audio amplifiers, class G audio amplifiers, class H audio amplifiers, and other audio amplifier topologies.

Power converter 110 of FIGS. 1-4 may include any circuit used to convert an input power signal into an output power signal. For example, a power converter may be an alternating-current ("AC") to direct-current ("DC") power converter. For an embodiment of the present invention, an AC to DC power converter is used to convert an AC mains power supply to DC power supply for an audio power amplifier. One such implementation of an AC to DC power supply includes using a switching power converter. An example of a switching power converter uses a transformer, a rectifier, and a pulse-width modulator to convert an AC mains electrical power, such as a 120 volts AC operating at 60 Hz or any other AC power format, to DC electrical power. Another embodiment includes using a linear power converter to convert an AC power source to a DC power source. Alternatively, power converter 110 may be a DC to DC power converter.

The integration of an audio power amplifier 105 and a power converter 110 into a single integrated circuit or IC package provides the ability to optimize the performance and efficiency of the audio power amplifier 105 and the power converter 110.

Figure 5:
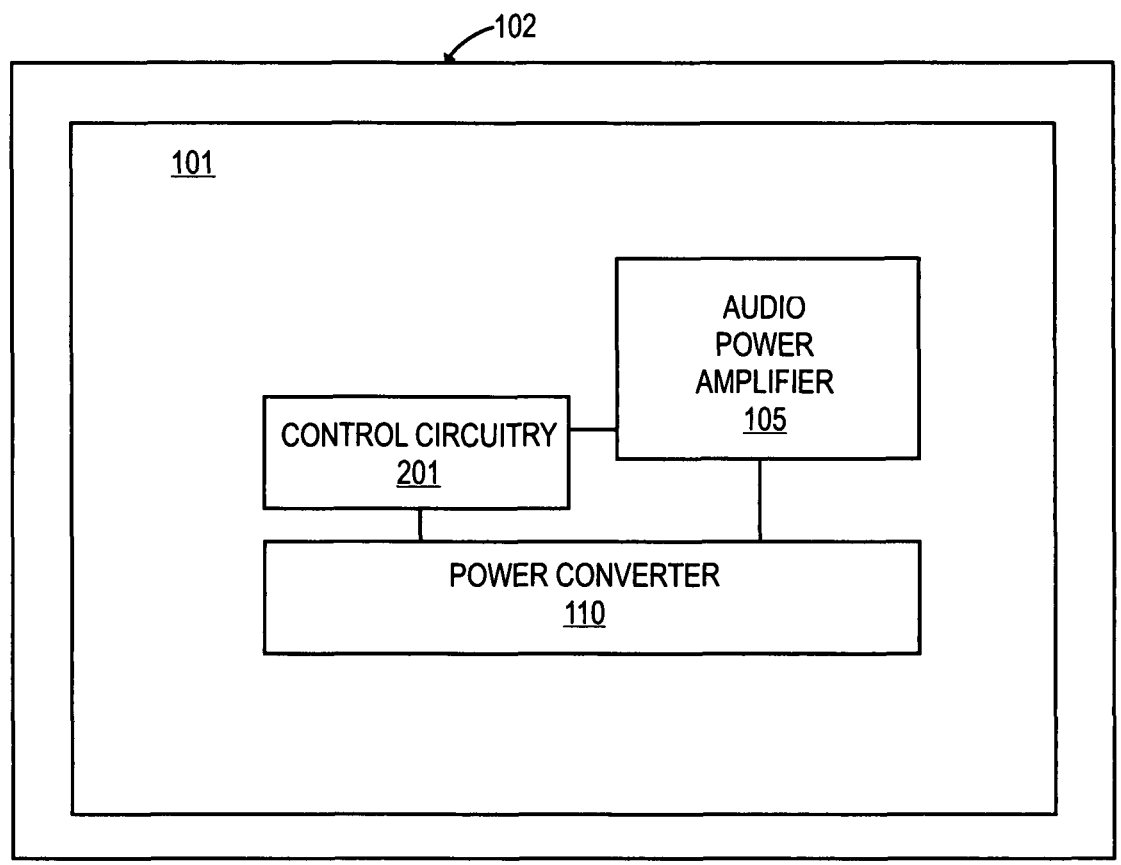
FIG. 5 illustrates a device with an audio power amplifier, a power converter, and control circuitry on a single integrated circuit.

FIG. 5 shows an integrated circuit with control circuitry coupled to audio power amplifier 105 and power converter 110. Audio power amplifier 105, power converter 110, and control circuitry 201 reside on the same substrate 101 within IC package 102. Alternatively, control circuitry 201 can be tightly integrated with audio power amplifier 105 and power converter 110 (similar to the embodiments of FIGS. 2 and 3) or can reside on its own separate substrate within a common package (adding a third substrate for control circuitry 201 to the embodiment of FIG. 4).

Control circuitry 201 performs output sensing and feedback functions. The control circuitry 201 is used for an embodiment to further optimize the performance of an audio power amplifier 105 and power converter 110.

For one embodiment, control circuitry 201 monitors the output of power converter 110. Control circuitry 201 may use the current value of the output of power converter 110 as part of a feedback loop to ensure the output of power converter 110 is maintained at an optimum level for audio power amplifier 105. Upon detection of an irregularity in the voltage supplied to audio power amplifier 105, the change in the output voltage may be used as part of a feedback loop to maintain the output voltage at the proper level. For an embodiment using a switching power converter, the feedback loop may be used to adjust the duty cycle of a pulse width modulator to maintain the proper power output despite changes in the demand of audio amplifier 105.

Moreover, control circuitry 201 may be used to monitor the signal provided as an input of audio power amplifier 105. For an embodiment, control circuitry 201 adjusts operating characteristics of the power converter 110 in response to the signal provided as an input to audio power amplifier 105. For example, control circuitry 201 may adjust the duty cycle of a power converter 110 in response to the signal level of the input of the audio power amplifier 105. Such a technique ensures audio power amplifier 105 operates properly for a given input, thus minimizing distortion at the output of audio power amplifier 105.

For another embodiment, control circuitry 201 includes a feedback loop that monitors the output of the audio amplifier 105 with respect to the input. This feedback loop may be used to adjust an operating characteristic of audio power amplifier 105 to minimize distortion of the output signal. Operating characteristics of an audio power amplifier 105 that may be changed include bias currents and bias voltages. Adjusting bias currents and/or bias voltages of an audio power amplifier 105 affects the operating point of the audio power amplifier 105 and may be used to enhance the performance of the audio power amplifier 105.

Moreover, the control circuitry 201 may include circuitry that uses shaping techniques on the input signal to shape or predistort the input to audio power amplifier 105. The shaping of the input signal minimizes distortion of the output signal because the signal is pre-distorted to compensate for the distortion effects of the audio power amplifier 105. Such shaping techniques may include shaping the input signal using analog filtering, digital filtering, or a combination of the two filtering techniques. An embodiment includes the use of an adaptive filter to shape the input signal of an audio power amplifier 105 responsive to the output signal of the audio power amplifier 105.

Figure 6:
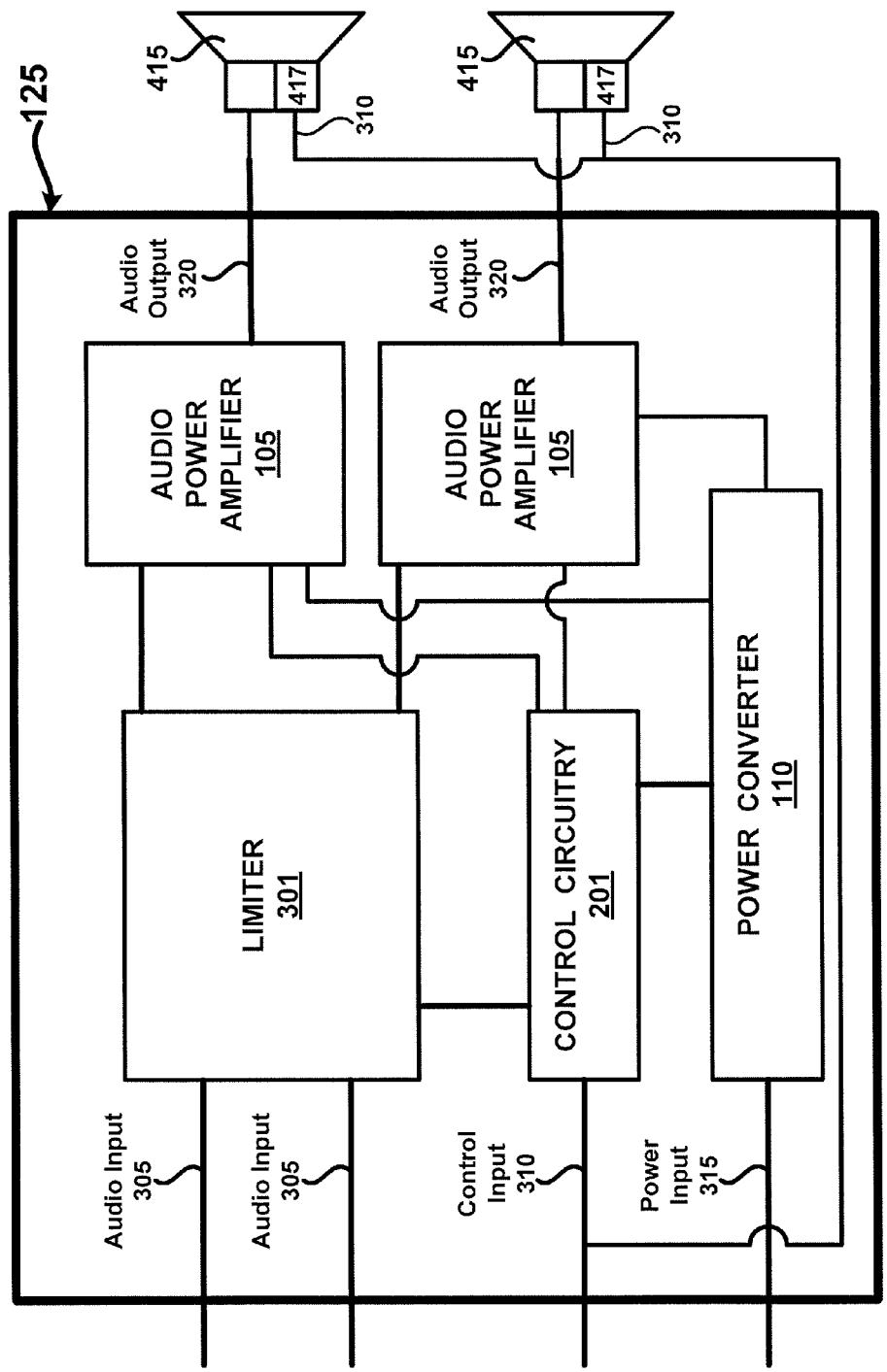
FIG. 6 shows a device with two audio power amplifiers, a power converter, control circuitry, and a limiter on a single integrated circuit.

FIG. 6 illustrates an integrated circuit 125 that includes two audio power amplifiers 105, a limiter 301, control circuitry 201, and a power converter 110. The integrated circuit 125 also includes an audio input 305, control input 310, power input 315, and an audio output 320. The audio input 305 and audio output 320 may be analog signals or digital signals. Moreover, an audio input 1305 and audio output 320 may carry one or a plurality of audio channels on one or a plurality of pins. For an embodiment, an audio input 305 may be a digital signal that complies with the Sony/Philips Digital Interface Format ("SPDIF"). Another interface that may be used as audio input 305 for an embodiment of the integrated circuit 125 includes an inter-IC sound bus (I2C). The inter-IC sound bus includes three lines: a continuous serial clock line, a word select line, and a serial data line.

Integrated circuit 125 includes a control input 310 that may be one or a plurality of input pins into the integrated circuit 125. An embodiment of integrated circuit 125 may include an inter-integrated circuit bus used as a control input 310. Control input 310 may be used for volume control, to program control circuitry, to program a limiter 301, or for other signals that may be used by control circuitry 201 to optimize performance of audio power amplifier 105 or power converter 110. Such an example of a control signal that may be used by control circuit 201 to optimize performance of audio power amplifier 105 is an accelerometer sensor 417 used to measure the output of a speaker 415 that is connected to the audio power amplifier 105. The accelerometer sensor 417 connected to the speaker 415 provides information about the quality of the output from the audio power amplifier 105 at the speaker. This information may then be used by control circuit 105 to modify an operating characteristic of internal circuitry of the integrated circuit 125. For example, control circuitry 201 may adjust the bias point of audio power amplifier 105 responsive to input 310 from an input sensor, such as an accelerometer sensor 417

Limiter 301 may be used in conjunction with control circuitry 201 to ensure that the input signal does not exceed the parameters that an audio power amplifier 105 is capable of reproducing without a great deal of distortion. For one embodiment, control circuitry 201 monitors the power input 315 into power converter 110. A power signal on power input 315 may be an AC or DC power signal. For an embodiment, power input 315 is connected to an AC main power source.

The input power into power converter 110 is important because as the power demand of audio power amplifier 105 increases, the power converter 110 must adjust to meet the demands of audio power amplifier 105. This adjustment ensures that audio power amplifier 105 is operating under conditions that will minimize distortion of the output signal on audio output 320. If the input power is a poor quality power signal, the input voltage may be too low for power converter 110 to meet the power demands of audio power amplifier 105. Problems that create poor input power conditions include dropout, surge, over-voltage, spiking, noise, and low voltage conditions on the input voltage signal. Therefore, control circuitry 201 may monitor both the input to audio power amplifier 105 and the power input 315 into power converter 110. Based on the quality of the input power, the control circuitry 201 may be used to configure limiter 301 to restrict the input into the audio power amplifier 105 to minimize distortion of the signal at the output.

Moreover, the control circuitry 201 may be used to put the power supply in a stand-by mode upon determining no audio signal is present at the input of audio power amplifier 105. For example, control circuitry 201 may monitor the input of the audio power amplifier 105 for a period of time and force the audio power amplifier 105 and power converter 110 into a state to minimize power consumption if no signal is detected. Moreover, control circuitry 201 may sense the presence of an audio input signal and force audio power amplifier 105 and power converter 110 out of a stand-by mode. The use of a stand-by mode further improves the overall power efficiency of an embodiment of the integrated circuit 100.

Another embodiment includes a limiter 301 that may be programmed to restrict the input signal to limit the input into audio power amplifier 105 to a predetermined level. The ability to program limiter 301 at different levels provides a way to restrict the audio output power levels to levels below the capabilities of the audio power amplifier 105. This is useful if one needs to use an embodiment of the integrated circuit 125 having a higher audio power output than the audio system connected to the integrated circuit 125. This allows a designer to modify the output characteristics of an embodiment of the integrated circuit 125 to meet the needs of the audio system that is being designed, instead designing an audio system around the integrated circuit 125.

For alternative embodiments, limiter 301 of FIG. 6 can be tightly integrated with audio power amplifier 105 and power converter 110 (similar to the embodiments of FIGS. 2 and 3) or can reside on its own separate substrate within a common package (having separate respective substrates for limiter 301, control circuitry 201, audio power amplifiers 105, and power converter 110).

For various embodiments, integrated circuit 125 can be packaged in various manners.

Figure 7:
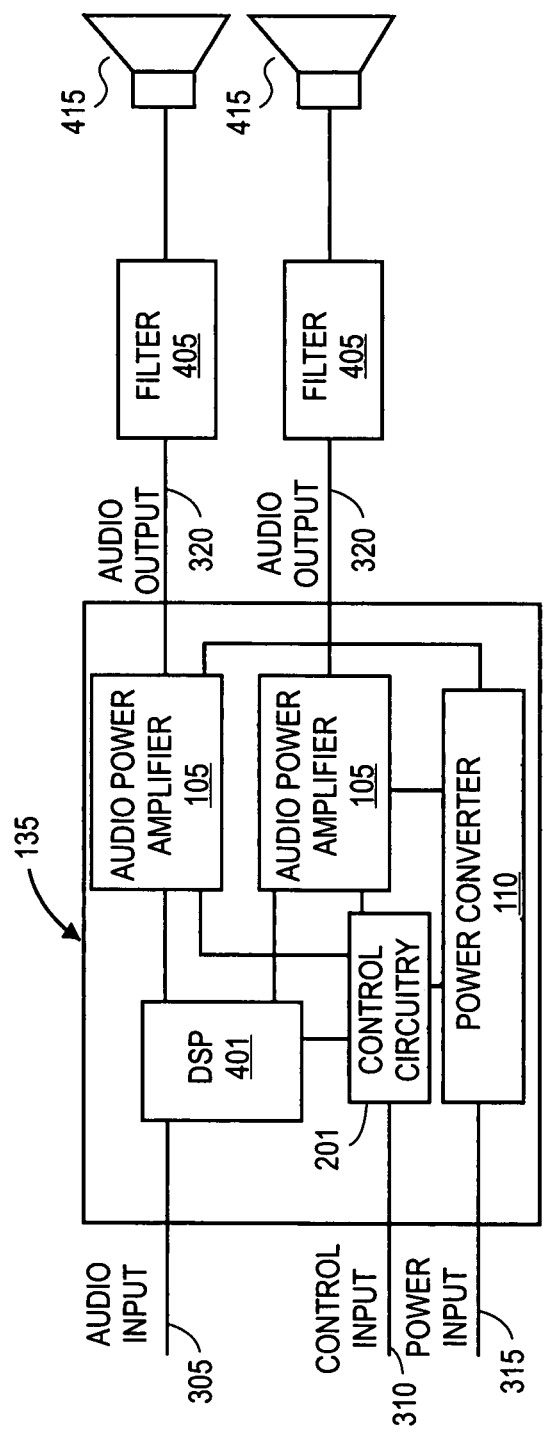
FIG. 7 shows an audio system with an integrated circuit having a DSP, control circuitry, a power converter, and two audio power amplifiers.

FIG. 7 illustrates an audio system that includes integrated circuit 135 having digital signal processing ("DSP") circuitry 401. DSP circuitry 401 may be used to filter or shape the input audio signal. Moreover, the DSP circuitry 401 may be used to perform operations such as limiting the input signal and shaping the input signal based on input from control circuitry 201. DSP circuitry 401 may also be used to monitor the spectral content of an input signal. For one embodiment, DSP circuitry 401 uses a fast Fourier transform (or another frequency analysis technique) to determine the frequency content of an input signal. Based on the spectral content of the input signal, the DSP circuitry 401 provides information to control circuitry 201 for controlling an operating characteristic of power converter 110.

Alternatively, DSP circuitry 401 can be tightly integrated with control circuitry 201, power converter 110, and audio power amplifiers 105 (similar to the embodiments of FIGS. 2 and 3) or can reside on its own separate substrate within a common package (resulting in separate substrates for control circuitry 201, power converter 110, and audio power amplifiers 105).

For various embodiments, integrated circuit 135 can be packaged in various ways, such as using a DIP package, a flip-chip package, a ball grid array package, a stacked package, or a chipscale package, for example.

The audio system of FIG. 7 further illustrates integrated circuit 135 connected to speaker transducers 415 through filters 405. For an embodiment of integrated circuit 135 having audio power amplifiers 105 that are class D audio amplifiers, filters 405 may be lowpass filters. The lowpass filters 405 may be used as respective output filter stages of the class D audio amplifiers. This would provide a way to fine-tune the performance of an embodiment of the integrated circuit 135 for a particular audio system. Each speaker 415 may be one or a plurality of speakers such as a multi-way speaker. For example, a multi-way speaker 415 may include a cross-over that provides higher frequencies to a tweeter (high-frequency transducer) and the lower frequencies to a woofer (low-frequency transducer).

Integrated circuit 135 may also be connected to external passive components when used in an audio system. Passive components include electronic devices such as—but not limited to—resistors, capacitors, and inductors. For an embodiment, integrated circuit 135 may use an external inductor as part of power converter 110 to convert an input power signal into an output power signal for audio power amplifiers 105. Moreover, external discrete passive components may be used as part of control circuitry 201 for optimizing performance of audio power amplifiers 105. Furthermore, external passive components, such as capacitors, may be used to set up an operating point for audio power amplifiers 105. Therefore, external components, such as passive or active components, may be used by integrated circuit 135 to change performance characteristics or ensure proper operation of integrated circuit 135.

For one embodiment, audio power amplifiers 105 are class-D power amplifiers and power converter 110 is a switching-mode power supply. This allows integrated circuit 135 to be power efficient. The high power efficiency results from the use of switching components in both the class D power amplifiers 105 and in the power supply 110. For example, a class D power amplifier may have a power efficiency of 80% or greater. The use of high efficiency power amplifiers 105 and power supply 110 minimizes the heat dissipated by those components. This alleviates the need for costly heat sinks and advanced semiconductor processing techniques needed to keep an integrated circuit performing at an optimum temperature to prevent failure because of overheating.

In the foregoing specification, specific exemplary embodiments of the invention have been described. It will, however, be evident that various modifications and changes may be made thereto. The specification and drawings are, accordingly, to be regarded in an illustrative rather than a restrictive sense.

What is claimed is:

1. An apparatus comprising:
a single substrate having circuitry formed on the single substrate, the single substrate is positioned within an integrated circuit package, the circuitry including an audio power amplifier disposed on a first substrate area of the single substrate and, an alternating-current to direct-current power converter disposed on a second substrate area of the single substrate and coupled to the audio power amplifier to supply power to the audio power amplifier, wherein either the first substrate area comprises substantially a subset of the second substrate area, or the second substrate area comprises substantially a subset of the first substrate area;
control circuitry coupled to the audio power amplifier and the alternating-current to direct-current power converter, the control circuitry being configured to receive a control signal generated by an accelerometer sensor including data representative of the output of a speaker and to modify an operating characteristic of the alternating-current to direct-current power converter, to modify an operating characteristic of the audio power amplifier by adjusting a bias current, a bias voltage or both to affect an operating point of the audio power amplifier or by adjusting a bias point, responsive to the control signal; and
a digital signal processing circuitry coupled to the audio power amplifier in a single package and configured to conduct a frequency analysis on an input signal.

2. The apparatus of claim 1, wherein the control circuitry is coupled to the audio power amplifier, the digital signal processing circuitry and the power converter.

3. The apparatus of claim 2, wherein the control circuitry adjusts operating characteristics of the power converter responsive to the input signal.

4. The apparatus of claim 2, wherein the control circuitry further is configured to limit a signal provided to the input.

5. The apparatus of claim 1, wherein the alternating-current to direct-current power converter is a switching-mode power supply.

6. The apparatus of claim 5, wherein the audio power amplifier is a class D audio amplifier.

7. An integrated circuit comprising:
a single substrate including the following circuitry formed on the single substrate:
an audio power amplifier disposed on a first substrate area of the single substrate;
a power converter disposed on a second substrate area of the single substrate to supply the audio power amplifier with a direct-current power source, wherein either the first substrate area comprises substantially a subset of the second substrate area, or the second substrate area comprises substantially a subset of the first substrate area;
control circuitry coupled to the audio power amplifier and the power converter to monitor an output of the power converter and to adjust an operating characteristic of the power converter responsive to the output of the power converter, the control circuitry being further configured to receive a control signal including accelerometer-related data representative of the output of a speaker and to modify the operating characteristic of the power converter, to modify an operating characteristic of the audio power amplifier by adjusting a bias current, a bias voltage or both to affect an operating point of the audio power amplifier or by adjusting a bias point, responsive to the control signal; and
digital signal processing circuitry coupled to the control circuitry and the audio power amplifier, and configured to conduct a frequency analysis of an input signal.

8. The integrated circuit of claim 7, wherein the power converter is a switched-mode power supply.

9. The integrated circuit of claim 8, wherein the control circuitry monitors the output of the power converter for voltage droop and adjusts a duty cycle of the power converter responsive to the voltage droop.

10. The integrated circuit of claim 8, wherein the audio power amplifier is a class D audio power amplifier.

11. The integrated circuit of claim 7, wherein the control circuitry modifies the input signal responsive to detection of distortion of an output signal of the audio power amplifier.

12. The integrated circuit of claim 7, wherein the control circuitry further is configured to limit a signal level of an input to the audio power amplifier.

13. An audio system comprising:
an integrated circuit including a single substrate including the following circuitry formed on the single substrate:
a first audio power amplifier disposed on a first substrate area of the single substrate;
a power converter disposed on a second substrate area of the single substrate and configured to provide power to the first audio power amplifier, wherein either the first substrate area comprises substantially a subset of the second substrate area, or the second substrate area comprises substantially a subset of the first substrate area;
control circuitry configured to modify an operating characteristic of the power converter responsive to an operating condition of the first audio power amplifier, and
digital signal processing circuitry configured to provide information associated with a frequency analysis to the control circuitry;
a speaker coupled with the integrated circuit to reproduce an audio signal amplified by the first audio power amplifier; and
an accelerometer sensor configured to generate a control signal including data representative of the output of the speaker, wherein the control circuitry is further configured to modify the operating characteristic of the power converter, to modify an operating characteristic of the first audio power amplifier by adjusting a bias current, a bias voltage or both to affect an operating point of the audio power amplifier or by adjusting a bias point, responsive to the control signal.

14. The audio system of claim 13, wherein the integrated circuit includes a second audio power amplifier powered by the power converter.

15. The audio system of claim 14, wherein the control circuitry further is configured to restrict a signal level of a first input signal into the first audio power amplifier and a second input signal into the second audio power amplifier.

16. The audio system of claim 15, wherein the level of the first input signal and the second input signal is programmable.

17. The audio system of claim 15, wherein the control circuitry adjusts the level of the first input signal and the second input signal responsive to an input power signal for the power converter.

18. The audio system of claim 14, wherein the audio power amplifier is a class D audio amplifier.

19. The audio system of claim 13, wherein the control circuitry modifies a duty cycle of the power converter responsive to an input signal to the first audio power amplifier.

* * * * *